United States Patent [19]

Nelson

[11] Patent Number: 4,628,279
[45] Date of Patent: Dec. 9, 1986

[54] WIDEBAND FEEDBACK AMPLIFIER

[75] Inventor: David A. Nelson, Loveland, Colo.

[73] Assignee: Comlinear Corporation, Fort Collins, Colo.

[21] Appl. No.: 813,590

[22] Filed: Dec. 26, 1985

[51] Int. Cl.⁴ ............................................. H03F 3/45
[52] U.S. Cl. .................................... 330/257; 330/260; 330/293; 330/288; 330/311
[58] Field of Search ............... 330/257, 260, 288, 293, 330/311; 323/315, 316

[56] References Cited

U.S. PATENT DOCUMENTS 4,042,886  8/1977  Hanna .............................. 330/260 X Primary Examiner—James B. Mullins

[57] ABSTRACT

Current feedback is employed in differential and unbalanced input wideband feedback amplifiers to render bandwidth and transient response insensitive to closed loop gain over a wide range.

10 Claims, 11 Drawing Figures

WIDEBAND FEEDBACK AMPLIFIER

REFERENCE TO RELATED PATENTS

This application is related to the subject matter of U.S. Pat. Nos. 4,358,739 and 4,502,020. The subject matter thereof is incorporated herein by reference.

BACKGROUND AND SUMMARY OF THE INVENTION

This invention relates generally to the method of current feedback taught in the above-referenced related patents that are directed to wideband direct-coupled transistor amplifiers. These prior art amplifiers offer very wide bandwidth and fast settling time, but lack the ability to provide the same precise input offset voltage, low input bias current, and low drift capabilities available in conventional voltage feedback operational amplifiers. The differential input pair of transistors used in the conventional operational amplifier offers precision performance based upon the ability to closely match two or more transistors of the same type, expecially if monolithic integrated circuit techniques are used. The shortcoming in the prior art wideband direct-coupled transistor amplifiers arises primarily from the unconventional input stage in which an NPN/PNP transistor buffer amplifier having high input impedance and low output impedance replaces the conventional differential transistor pair input stage. Given the current feedback inputs described in connection with these types of amplifiers, achieving close matching of NPN and PNP transistors is difficult.

Three embodiments of the present invention utilize the advantages of precision available with a true differential input while retaining the use of current feedback. The performance of these configurations resembles that of an instrumentation amplifier in that the magnitudes of inverting and non-inverting gains can be made equal and in that good common mode rejection can be obtained. However, this is only one special case, and in general the inverting and non-inverting gains can be simultaneously and independently set. A second non-inverting input is also available for setting output reference voltages or for use in applying a second non-inverting input signal. In addition to the three voltage input terminals, low input impedance inverting and non-inverting input terminals also exist for the direct input of current signals. The gain, offset, and common mode properties of the amplifier are set by the selection of three resistor values. Since the amplifiers use current feedback, the −3 db bandwidth, settling time, and other dynamic performance parameters remain nearly constant and independent of gain settings over a very wide range of gain without the need for any change in compensation. The output is a single-ended voltage. Two of these three embodiments of the present invention are particularly well suited for monolithic integration since no high frequency PNP transistors are required.

In the remaining two embodiments of the present invention, some of the flexibility and advantages inherent in the first three embodiments have been sacrificed in order to return to the more conventional unbalanced signal input configuration of operational amplifiers (two gain setting resistors) using current feedback as described in the above-referenced prior art patents. This is done to retain compatibility with those operational amplifiers which are used on such a wide scale in the industry. These last two embodiments of the present invention are special cases of the first three embodiments in that they retain the attendant advantages of current feedback, low input offset voltage, and the absence of high frequency PNP transistors which make monolithic construction difficult and expensive. The advantage of low input bias current is also available if the circuit is carefully designed and process parameters are tightly controlled.

DETAILED DESCRIPTION OF THE ILLUSTRATED EMBODIMENTS OF THE INVENTION

The following description and the appended drawings teach the present invention in terms of NPN bipolar transistors. Those persons skilled in the art will understand that many other types of devices, including but not limited to PNP, FET, MOSFET, and compound transistors, may be readily substituted for the NPN bipolar transistors described and illustrated.

Figure 1:
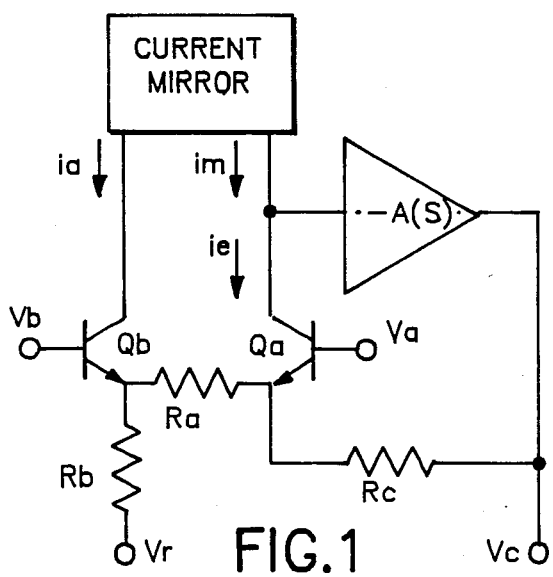
FIG. 1 is a schematic diagram of one embodiment of a wideband feedback amplifier in which a current mirror is employed.
Figure 3:
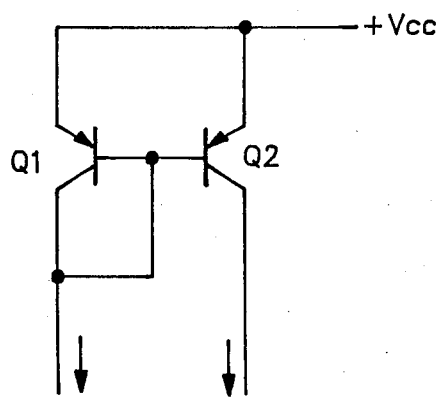
FIG. 3 is a schematic diagram of one configuration of the current mirror employed in the wideband feedback amplifier of FIGS. 1 and 1A.
Figure 4:
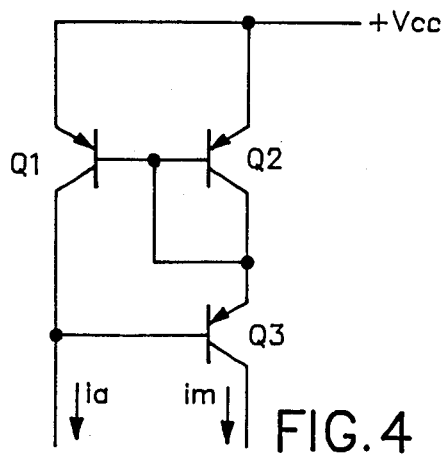
FIG. 4 is a schematic diagram of an alternative configuration of the current mirror employed in the wideband feedback amplifier of FIGS. 1 and 1A.

Referring now to FIG. 1, there is shown one circuit embodiment of the wideband feedback amplifier of the present invention. For purposes of computing the transfer function of this circuit, as well as the other circuits illustrated, DC biasing may be ignored. Thus, it is assumed that the DC base-emitter voltages of transistors Qa and Qb are equal to zero and can therefore be ignored. As a result $Vc=(im-ie)(-A(s))$ where im- $= ia = (Vb-Vr)/Rb + (Vb-Va)/Ra$ and $ie = (-Va-Vc)/Rc + (Va-Vb)/Ra$. The input to the current mirror is the current labelled ia and the output is the current labelled im, with im being approximately equal to ia. FIGS. 3 and 4 show two alternative circuit realizations of the current mirror, and many others are known in the prior art. Solving the above equation, $Vc = [Va(1+2Rc/Ra) - Vb(Rc/Rb + 2Rc/Ra) + Vr(Rc/Rb)]/(1+Rc/A(s))$. $A(s)$ is a frequency dependent term containing the poles and zeroes which represent the frequency dependent gain of the internal gain stage illustrated. As implied in the equation above defining Vc, negative feedback seeks to maintain currents ie and im equal to each other, thus maintaining the base-emitter voltages of Qa and Qb equal, as was originally assumed. The values of Ra and Rb do not influence the frequency dependent term of the expression for Vc, but since they do control the magnitude of the transfer functions Vc/Va, Vc/Vb, and Vc/Vr, closed loop gain and dynamic characteristics such as $-3$ db bandwidth are independent of each other. In the case where Rb=Rc, the relation of Vc to Vr is that Vc=Vr as long as Va=Vb. Thus, for Rb=Rc, the common mode rejection of the amplifier is very good. Also for Rb=Rc, the transfer functions $Vc/Va = -Vc/Vb$, so the amplifier works well as a precision, closed loop subtraction stage with a single-ended output.

Considering now the effect of DC bias conditions in the circuit of FIG. 1 which were ignored in the analysis above, the amplifier can only function if $(Vb-Vbeqb) > Vr$ so that Vbeqb is forward biased and so that ia and ie are greater than zero. Vbeqb represents the base-emitter voltage (Vbe) of transistor Qb. If current sources Isa and Isb are added to sink current from the emitter nodes of Qa and Qb, respectively, these transistors can be forward biased with positive collector current even when $(Vb-Vbeqb) < Vr$. Isa and Isb can be fixed or variable (signal) current sources. The complete equation for Vc becomes $Vc = [Va(1+2Rc/Ra) - Vb(Rc/Rb + 2Rc/Ra) + Vr(Rc/Rb) + (Isa-Isb)Rc]/(1+Rc/A(s))$. It should be noted that the internal gain stage $A(s)$ is employed in the inverting configuration. It does not matter, however, whether $A(s)$ is any combination of current or voltage input, with current or voltage output.

The DC accuracy of the circuit of FIG. 1 is excellent. Because currents ie and ia are maintained nearly equal by the action of negative feedback, the base-emitter voltages of Qa and Qb will be kept nearly equal as long as the transistor characteristics are well matched. Likewise, bias currents at the inputs will be nearly equal. Because of finite Early Voltages in these transistors, however, some errors in input offset voltage and input bias currents may be caused. To prevent this, several steps may be taken. The current mirror may be modified to maintain the collector-base voltages of Qa and Qb equal; transistors Qa and Qb may be replaced with cascode transistor pairs; or darlington input pairs or other more complex input schemes may be used. The circuits illustrated in FIGS. 2, 2A, 2B, and 6 also overcome this difficulty without lowering performance in other areas.

Figure 1A:
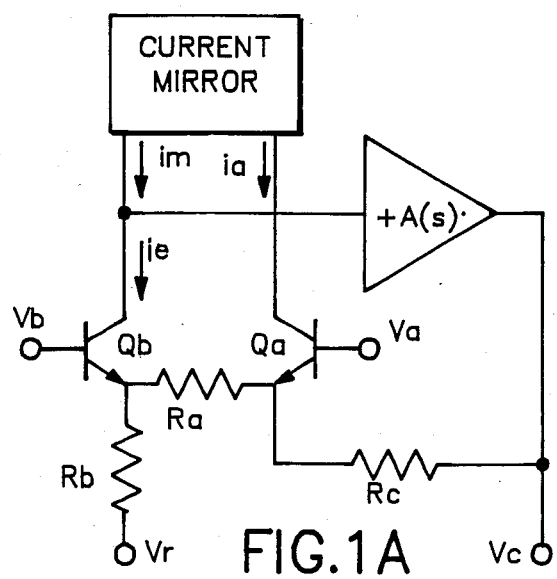
FIG. 1A is a schematic diagram of an alternative embodiment of the wideband feedback amplifier of FIG. 1 in which a non-inverting internal gain stage is employed.

The circuit of FIG. 1A differs from that of FIG. 1 described above only in that a non-inverting internal gain stage $A(s)$ has been substituted for the inverting internal gain stage of FIG. 1, and its input is the collector of transistor Qb, which is 180 degrees out of phase with the collector of transistor Qa. To accommodate this change the input and output of the current mirror have been exchanged, as illustrated in FIG. 1A. These two sign changes cancel each other, so the input/output transfer function is the same as that described in detail above for FIG. 1.

Figure 2:
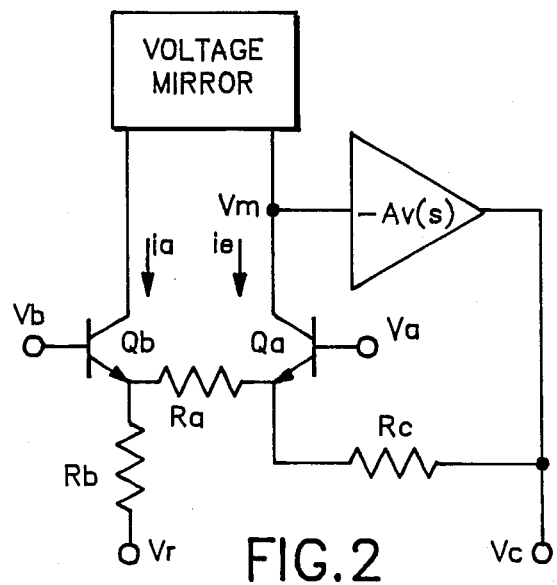
FIG. 2 is a schematic diagram of another embodiment of a wideband feedback amplifier in which a voltage mirror is employed.
Figure 2A:
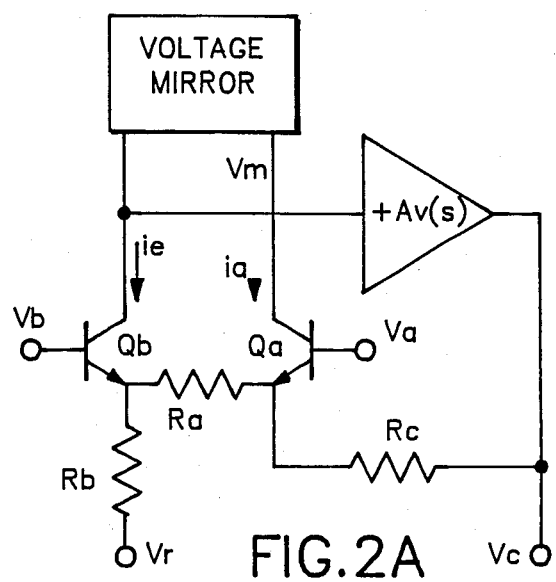
FIG. 2A is a schematic diagram of an alternative embodiment of the wideband feedback amplifier of FIG. 2 in which a non-inverting internal gain stage is employed.
Figure 2B:
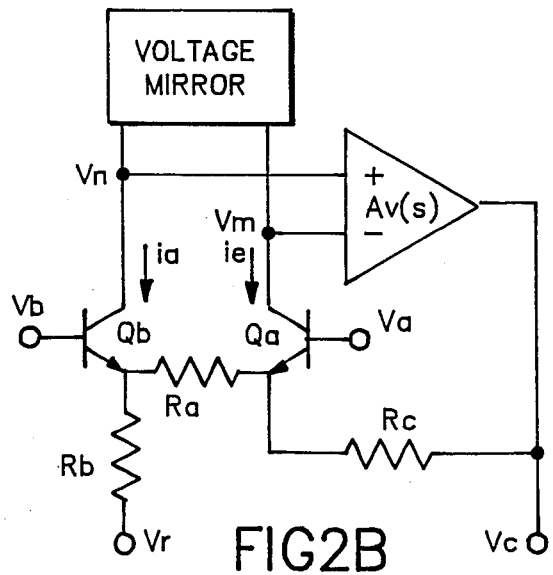
FIG. 2B is a schematic diagram of another alternative embodiment of the wideband feedback amplifier of FIG. 2 in which a differential internal gain stage is employed.
Figure 5:
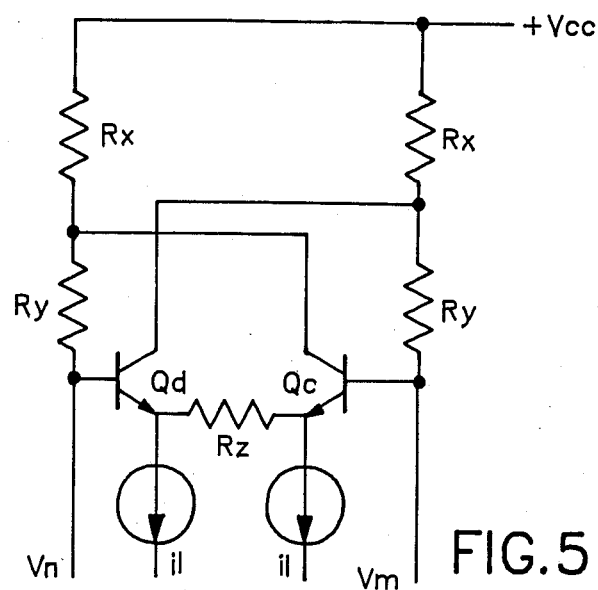
FIG. 5 is a schematic diagram of one configuration of the voltage mirror employed in the wideband feedback amplifier of FIGS. 2, 2A, and 2B.

Referring now to the circuit of FIG. 2, it is first necessary to understand the concept of the illustrated voltage mirror. The current mirrors illustrated in FIGS. 3 and 4 require PNP transistors that have a frequency response nearly equal to that of the NPN transistors Qa and Qb. If those transistors are unavailable or undesirable for use, a voltage mirror may be constructed using NPN transistors. The necessary characteristic is that an input signal, whether it is a single-ended or a balanced current, must produce the condition of $vn = -vm$ so that the common mode and low input offset voltage characteristics of the circuit of FIG. 1 will exist in the amplifier of FIG. 2. FIG. 5 illustrates a cross-coupled amplifier which employs positive feedback to cause a voltage mirroring action. It also increases the apparent impedance seen by the collector currents of transistors Qa and Qb to increase the loop gain of the amplifier illustrated in FIG. 2. When the circuit of FIG. 4 is driven by balanced differential current inputs at nodes vn and vm, $vn/ia = -vm/ie = (Rx+Ry)/(1-2Rx/Rz)$. The degree of mirroring action $vm/vn = Rx/(Rx-Rz)$, and ideally this ratio should be close to $-1$ for optimum performance. The use of a voltage mirror as illustrated in FIGS. 2, 2A, and 2B offers significant advantages over the wideband feedback amplifier circuits of FIGS. 1, 1A, and 6. The voltage mirror is placed in a shunt position with respect to the signal path of the overall amplifier, which prevents an increase in group delay of the signal, but allows an increase in the open loop gain of the overall amplifier. This facilitates stable closed loop operation over wider bandwidths. In the absence of the voltage mirror, open loop gain can be increased only by adding amplification in series with the signal path, thus increasing group delay as well.

Referring further to the circuit of FIG. 2, $Vc = Vm(-Av(s))$. Letting $vm = (-ie)Ze + (ia)Ze$, where Ze is the equivalent impedance seen at the collectors of transistors Qa and Qb, Vc may then be rewritten as $Vc = (ia-ie)(-Av(s)Ze)$. This equation leads to the same expression for Vc as in the circuit of FIG. 1 except that $A(s)$ is replaced by the term $Av(s)Ze$. $Av(s)$ is a voltage input amplifier, but it may have either a voltage output or a current output. With the exception of improved insensitivity to Early Voltage as mentioned above, the circuit of FIG. 2 functions like that of FIG. 1.

The circuit of FIG. 2A differs from that of FIG. 2 described above only in that a non-inverting internal gain stage $Av(s)$ has been substituted for the inverting internal gain stage of FIG. 2, and its input is the collector of transistor Qb, which is 180 degrees out of phase with the collector of transistor Qa. These two sign changes cancel each other, so the input/output transfer function is the same as that described in detail above for FIG. 2.

The circuit of FIG. 2B differs from that of FIG. 2 described above only in that a differential internal gain stage has been substituted for the inverting internal gain stage of FIG. 2 or the non-inverting internal gain stage of FIG. 2A. This increases the open loop gain by a factor of 2, but if this factor is thought of as being included in the gain of the inverting gain stage of FIG. 2, the input/output transfer function remains the same as that for FIG. 2.

Figure 6:
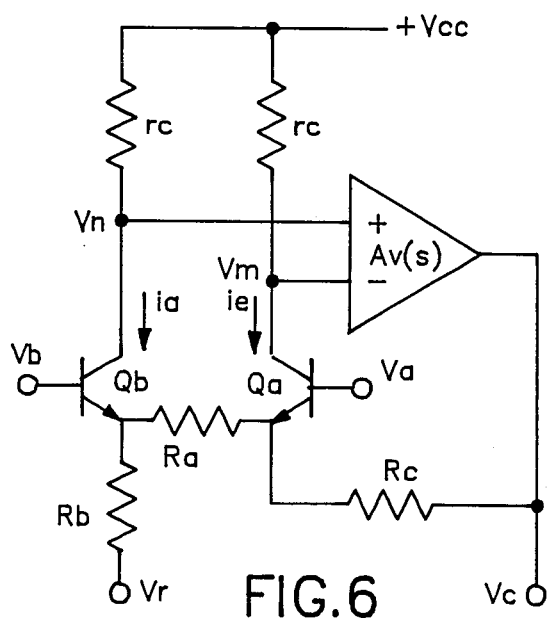
FIG. 6 is a schematic diagram of another embodiment of a wideband feedback amplifier in which a differential internal gain stage is employed.

Referring now to FIG. 6, the use of a voltage mirror to provide good common mode rejection and low input offset voltage is avoided by the use of amplifier Av(s) having differential voltage input and either voltage or current output. The disadvantage of this circuit is that either more group delay is incurred or the slew rate is sacrificed in order to achieve the same open loop gain as that of the amplifier of FIG. 2. Still, the circuit of FIG. 6 is useful in applications requiring low noise amplification. Vc=(ia−ie)(−Av(s)Rd), which leads to the same expression for Vc as in the circuit of FIG. 1 except that A(s) is replaced by the term Av(s)Rd. With the exception of improved insensitivity to Early Voltage as mentioned above, the circuit of FIG. 6 functions like that of FIG. 1.

Figure 7:
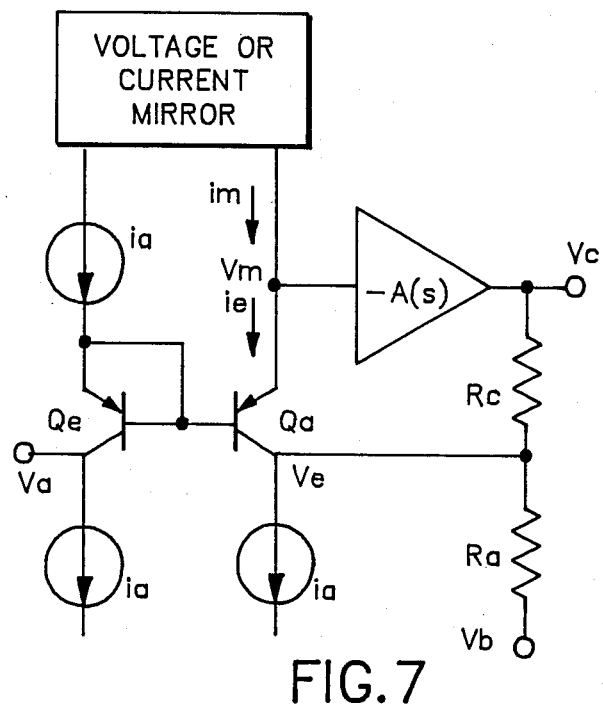
FIG. 7 is a schematic diagram of another embodiment of a wideband feedback amplifier employing unbalanced inputs with an open loop input buffer for offset compensation.

When the performance of the amplifier circuits of FIGS. 1, 1A, 2, 2A, 2B, and 6 is compared to the performance of the amplifier taught in prior art U.S. Pat. No. 4,502,020 it is seen that the advantages of the wideband feedback amplifier of the present invention are matched inverting and non-inverting gain, lower input offset voltage and bais current, and a higher common mode rejection ratio. In some applications, however, the operational amplifier configuration of the cited prior art patent may be preferred over the differential input configuration of the present invention illustrated in FIGS. 1, 1A, 2, 2A, 2B, and 6. However, the circuit of FIG. 7 is generally preferred over the cited prior art amplifier in that no high frequency PNP bipolar transistors are necessary in its construction. The operation of the circuit of FIG. 7 may be derived from the above analysis of the circuits illustrated in FIGS. 1, 1A, 2, 2A, 2B, and 6. Voltage Vb is fed directly to Ra without buffering from transistor Qb as before. Then, to offset the base-emitter voltage of transistor Qa so that the non-inverting input at Va and inverting input at Ve are at nearly equal voltages, transistor Qe is used. As before, transistor Qa provides a low input impedance to enable current feedback. A current mirror, voltage mirror or resistive load at the collector of transistor Qa insures a stable operating point for the amplifier. As in the analysis of the circuit of FIG. 1, Vc=(im−ie)(−A(s)) where im=ia and ie=ia+(Ve−Vb)/Ra+(Ve−Vc)/Rc. Then, since Ve=Va because of the offset from transistor Qe, Vc=[Ve(1+Rc/Ra)−Vb(Rc/Ra)]/(1+Rc/A(s)). Resistor Ra may be used to select the closed loop gain while Rc and A(s) may be chosen to provide optimum bandwidth, etc. A(s) may be any combination of voltage or current input, or voltage or current output.

Figure 8:
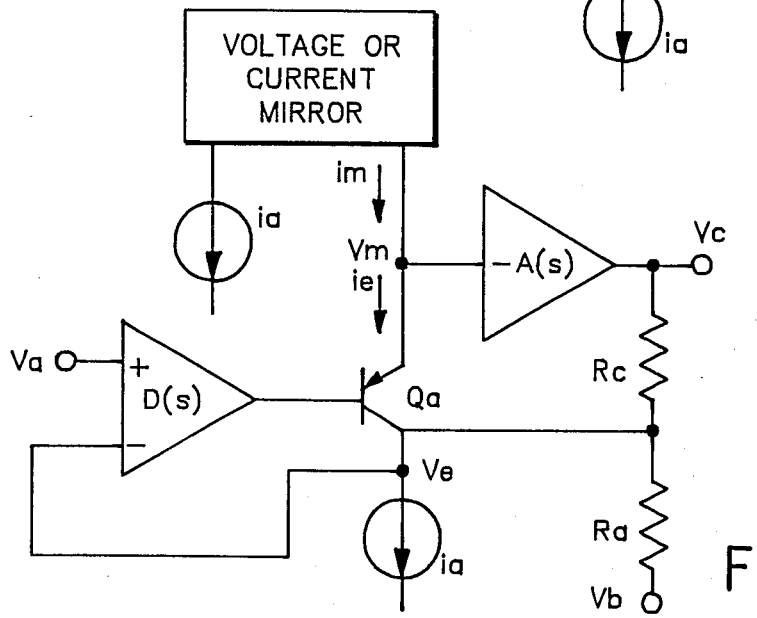
FIG. 8 is a schematic diagram of another embodiment of a wideband feedback amplifier employing unbalanced inputs with a closed loop input buffer for offset compensation.

FIG. 8 illustrates another embodiment of the wideband feedback amplifier circuit of FIG. 7, utilizing the same principles of operation. Whereas the input offset mechanism of the circuit of FIG. 7 does not utilize feedback to control the offset voltage (Va−Ve) and does not buffer transistor Qa, the circuit of FIG. 8 provides both of these functions through the addition of a differential input amplifier D(s). Through negative feedback, the voltage Ve is forced to equal Va. The expression for Vc in the circuits of both FIGS. 7 and 8 is the same. A current mirror, voltage mirror or resistive load as before at the collector of transistor Qa insures a stable operating point for the amplifier. The circuits of FIGS. 7 and 8 eliminate the need for the bias control circuit taught in the above-cited prior art patent. The present invention allows the DC bias to be stabilized by the use of a fixed current source reference rather than by using feedback as taught in the prior art. This greatly reduces circuit complexity and manufacturing costs.

The wideband feedback amplifier circuits of FIGS. 1, 1A, 2, 2A, 2B, 6, 7, and 8 all provide the benefits of current feedback operation. Thus, if Rc remains constant as Ra and/or Rb are varied to set the closed loop gain, the frequency dependent terms in the output/input transfer functions remain constant. This results in constant bandwidth, settling time, and distortion performance without the need for compensation. Further, it greatly simplifies the design and manufacture of systems in which this type of amplifier is used.

I claim:

1. A wideband feedback amplifier, the amplifier comprising:

first transistor means having at least first, second, and third terminals, the first terminal of which is connected to receive a first input signal;

second transistor means having corresponding first, second, and third terminals, the first terminal of which is connected to receive a second input signal;

a first resistance connected between the second terminal of said first transistor means and the second terminal of said second transistor means;

a second resistance connected between the second terminal of said first transistor means and a third input signal;

inverting gain means having an input connected to the third terminal of said second transistor means and having an output;

a third resistance connected between the second terminal of said second transistor means and the output of said inverting gain means; and current mirror means having a first terminal connected to the third terminal of said first transistor means and having a second terminal connected to the third terminal of said second transistor means for supplying a current to the third terminal of said second transistor means that is equal to a current flowing into the third terminal of said first transistor means.

2. A wideband feedback amplifier, the amplifier comprising:

first transistor means having at least first, second, and third terminals, the first terminal of which is connected to receive a first input signal;

second transistor means having corresponding first, second, and third terminals, the first terminal of which is connected to receive a second input signal;

a first resistance connected between the second terminal of said first transistor means and the second terminal of said second transistor means;

a second resistance connected between the second terminal of said first transistor means and a third input signal;

non-inverting gain means having an input connected to the third terminal of said first transistor means and having an output;

a third resistance connected between the second terminal of said second transistor means and the output of said non-inverting gain means; and current mirror means having a first terminal connected to the third terminal of said second transistor means and having a second terminal connected to the third terminal of said first transistor means for supplying a current to the third terminal of said first transistor means that is equal to a current flowing into the third terminal of said second transistor means.

3. A wideband feedback amplifier, the amplifier comprising:
   first transistor means having at least first, second, and third terminals, the first terminal of which is connected to receive a first input signal;
   second transistor means having corresponding first, second, and third terminals, the first terminal of which is connected to receive a second input signal;
   a first resistance connected between the second terminal of said first transistor means and the second terminal of said second transistor means;
   a second resistance connected between the second terminal of said first transistor means and a third input signal;
   inverting gain means having an input connected to the third terminal of said second transistor means and having an output;
   a third resistance connected between the second terminal of said second transistor means and the output of said inverting gain means; and
   voltage mirror means having a first terminal connected to the third terminal of said first transistor means and having a second terminal connected to the third terminal of said second transistor means for supplying a voltage at the third terminal of said second transistor means that is responsive to the difference between a current flowing into the third terminal of said first transistor means and a current flowing into the third terminal of said second transistor means, said voltage being in phase with the current flowing into the third terminal of said first transistor means and being of opposite phase with the current flowing into the third terminal of said second transistor means.

4. A wideband feedback amplifier, the amplifier comprising:
   first transistor means having at least first, second, and third terminals, the first terminal of which is connected to receive a first input signal;
   second transistor means having corresponding first, second, and third terminals, the first terminal of which is connected to receive a second input signal;
   a first resistance connected between the second terminal of said first transistor means and the second terminal of said second transistor means;
   a second resistance connected between the second terminal of said first transistor means and a third input signal;
   non-inverting gain means having an input connected to the third terminal of said first transistor means and having an output;
   a third resistance connected between the second terminal of said second transistor means and the output of said non-inverting gain means; and
   voltage mirror means having a first terminal connected to the third terminal of said first transistor means and having a second terminal connected to the third terminal of said second transistor means for supplying a voltage at the third terminal of said first transistor means that is responsive to the difference between a current flowing into the third terminal of said second transistor means and a current flowing into the third terminal of said first transistor means, said voltage being in phase with the current flowing into the third terminal of said second transistor means and being of opposite phase with the current flowing into the third terminal of said first transistor means.

5. A wideband feedback amplifier, the amplifier comprising:
   first transistor means having at least first, second, and third terminals, the first terminal of which is connected to receive a first input signal;
   second transistor means having corresponding first, second, and third terminals, the first terminal of which is connected to receive a second input signal;
   a first resistance connected between the second terminal of said first transistor means and the second terminal of said second transistor means;
   a second resistance connected between the second terminal of said first transistor means and a third input signal;
   differential gain means having a non-inverting input connected to the third terminal of said first transistor means, an inverting input connected to the third terminal of said second transistor means, and an output;
   a third resistance connected between the second terminal of said second transistor means and the output of said inverting gain means; and
   voltage mirror means having a first terminal connected to the third terminal of said first transistor means and having a second terminal connected to the third terminal of said second transistor means for supplying a voltage at the third terminal of said second transistor means that is responsive to the difference between a current flowing into the third terminal of said first transistor means and a current flowing into the third terminal of said second transistor means, said voltage being in phase with the current flowing into the third terminal of said first transistor means and being of opposite phase with the current flowing into the third terminal of said second transistor means, sais voltage mirror means being further operative for supplying a voltage at the third terminal of said first transistor means that is responsive to the difference between a current flowing into the third terminal of said second transistor means and a current flowing into the third terminal of said first transistor means, said voltage being in phase with the current flowing into the third terminal of said second transistor means and being of opposite phase with the current flowing into the third terminal of said first transistor means.

6. A wideband feedback amplifier, the amplifier comprising:
   first transistor means having at least first, second, and third terminals, the first terminal of which is connected to receive a first input signal;
   second transistor means having corresponding first, second, and third terminals, the first terminal of which is connected to receive a second input signal;
   a first resistance connected between the second terminal of said first transistor means and the second terminal of said second transistor means;
   a second resistance connected between the second terminal of said first transistor means and a third input signal;

differential gain means having an inverting input connected to the third terminal of said second transistor means, a non-inverting input connected to the third terminal of said first transistor means, and an output;

a third resistance connected between the second terminal of said second transistor means and the output of said differential gain means;

a fourth resistance connected between the third terminal of said first transistor means and a source of supply voltage; and a fifth resistance connected between the third terminal of said second transistor means and said source of supply voltage.

7. A wideband feedback amplifier, the amplifier comprising:

first transistor means having at least first, second, and third terminals, the second terminal of which is connected to receive a first input signal, and the first and third terminals of which are connected together;

second transistor means having corresponding first, second, and third terminals, the first terminal of which is connected to the first terminal of said first transistor means;

a first current source connected to the third terminal of said first transistor means;

a second current source connected to the second terminal of said first transistor means;

a third current source connected to the second terminal of said second transistor means;

inverting gain means having an input connected to the third terminal of said second transistor means and having an output;

a first resistance connected between the second terminal of said second transistor means and the output of said inverting gain means;

a second resistance connected between the second terminal of said second transistor means and a second input signal; and current mirror means having a first terminal connected to the first current source and having a second terminal connected to the third terminal of said second transistor means for supplying a current to the third terminal of said second transistor means that is equal to a current flowing from said first current source.

8. A wideband feedback amplifier, the amplifier comprising:

first transistor means having at least first, second, and third terminals, the second terminal of which is connected to receive a first input signal, and first and third terminals of which are connected together;

second transistor means having corresponding first, second, and third terminals, the first terminal of which is connected to the first terminal of said first transistor means;

a first current source connected to the third terminal of said first transistor means;

a second current source connected to the second terminal of said first transistor means;

a third current source connected to the second terminal of said second transistor means;

inverting gain means having an input connected to the third terminal of said second transistor means and having an output;

a first resistance connected between the second terminal of said second transistor means and the output of said inverting gain means;

a second resistance connected between the second terminal of said second transistor means and a second input signal; and voltage mirror means having a first terminal connected to said first current source and having a second terminal connected to the third terminal of said second transistor means for supplying a voltage at the third terminal of said second transistor means that is responsive to the difference between a current flowing into the third terminal of said first transistor means and a current flowing into the third terminal of said second transistor means, said voltage being in phase with the current flowing into the third terminal of said first transistor means and being of opposite phase with the current flowing into the third terminal of said second transistor means.

9. A wideband feedback amplifier, the amplifier comprising:

transistor means having at least first, second, and third terminals;

differential gain means having a non-inverting input for receiving a first input signal, an inverting input connected to the second terminal of said transistor means, and an output connected to the first terminal of said transistor means;

a first current source connected to the second terminal of said transistor means;

inverting gain means having an input connected to the third terminal of said transistor means and having an output;

a first resistance connected between the second terminal of said transistor means and the output of said inverting gain means;

a second resistance connected between the second terminal of said transistor means and a second input signal; and current mirror means having a first terminal connected to a second current source and having a second terminal connected to the third terminal of said transistor means for supplying a current to the third terminal of said transistor means that is equal to a current supplied by said second current source.

10. A wideband feedback amplifier, the amplifier comprising:

transistor means having at least first, second, and third terminals;

differential gain means having a non-inverting input for receiving a first input signal, an inverting input connected to the second terminal of said transistor means, and an output connected to the first terminal of said transistor means;

a first current source connected to the second terminal of said transistor means;

inverting gain means having an input connected to the third terminal of said transistor means, and having an output;

a first resistance connected between the second terminal of said transistor means and the output of said inverting gain means;

a second resistance connected between the second terminal of said transistor means and a second input signal; and voltage mirror means having a first terminal connected to a second current source and having a second terminal connected to the third terminal of said transistor means for supplying a voltage at the third terminal of said transistor means that is responsive to the difference between a current supplied by said second current source and a current flowing into the third terminal of said transistor means, said voltage being in phase with the current supplied by said second current source and being of opposite phase with the current flowing into the third terminal of said transistor means.

* * * * *